United States Patent
Wang et al.

(10) Patent No.: US 10,678,226 B1
(45) Date of Patent: Jun. 9, 2020

(54) ADAPTIVE NUMERICAL APERTURE CONTROL METHOD AND SYSTEM

(71) Applicant: KLA-Tencor Corporation, Milpitas, CA (US)

(72) Inventors: Qiang Wang, Davis, CA (US); Liequan Lee, Fremont, CA (US); Xin Li, Shanghai (CN); Qiang Zhao, Milpitas, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 380 days.

(21) Appl. No.: 15/214,371

(22) Filed: Jul. 19, 2016

Related U.S. Application Data

(60) Provisional application No. 62/203,298, filed on Aug. 10, 2015.

(51) Int. Cl.
| | |
|---|---|
| *G05B 19/418* | (2006.01) |
| *H01L 21/67* | (2006.01) |
| *H01L 21/66* | (2006.01) |
| *G01B 11/00* | (2006.01) |
| *G01N 21/956* | (2006.01) |

(52) U.S. Cl.
CPC ........ *G05B 19/41885* (2013.01); *G01B 11/00* (2013.01); *G01N 21/956* (2013.01); *H01L 21/67288* (2013.01); *H01L 22/12* (2013.01); *G01N 2201/12* (2013.01); *G05B 2219/40515* (2013.01); *G05B 2219/45031* (2013.01)

(58) Field of Classification Search
CPC .. G03F 7/705; G03F 7/70633; G03F 7/70625; G06F 17/5081; G06F 17/5009; G05B 19/41885; G05B 2219/40515; G05B 2219/45031; G01B 11/00; G01N 21/956; G01N 2201/12; H01L 21/67288; H01L 22/12
USPC ........................................................ 700/121
See application file for complete search history.

(56) References Cited

U.S. PATENT DOCUMENTS

| | | | |
|---|---|---|---|
| 5,608,526 | A | 3/1997 | Piwonka-Corle et al. |
| 5,859,424 | A | 1/1999 | Norton et al. |
| 6,429,943 | B1 | 8/2002 | Opsal et al. |
| 7,478,019 | B2 | 1/2009 | Zangooie et al. |
| 7,933,026 | B2 | 4/2011 | Opsal et al. |
| 9,291,554 | B2 | 3/2016 | Kuznetsov et al. |
| 9,581,430 | B2 | 2/2017 | Manassen et al. |
| 9,739,702 | B2 | 8/2017 | Bringoltz et al. |
| 2002/0039184 | A1* | 4/2002 | Sandusky ................. G01J 3/02 356/369 |

(Continued)

*Primary Examiner* — Rocio Del Mar Perez-Velez
*Assistant Examiner* — Alicia M. Choi
(74) *Attorney, Agent, or Firm* — Suiter Swantz pc llo

(57) ABSTRACT

Systems and methods for providing efficient modeling and measurement of critical dimensions and/or overlay registrations of wafers are disclosed. Efficiency is improved in both spectral dimension and temporal dimension. In the spectral dimension, efficiency can be improved by allowing different numerical aperture (NA) models to be used for different wavelengths in electromagnetic calculations, effectively providing a balance between computation speed and accuracy. In the temporal dimension, different NA models may be used at different iterations/stages in the process, effectively improving the computation speed without sacrificing the quality of the final result.

18 Claims, 3 Drawing Sheets

(56) References Cited

U.S. PATENT DOCUMENTS

| | | | |
|---|---|---|---|
| 2004/0181768 A1* | 9/2004 | Krukar | G03F 7/705 |
| | | | 716/51 |
| 2007/0242251 A1* | 10/2007 | Hansen | G03F 7/70108 |
| | | | 355/67 |
| 2008/0140590 A1* | 6/2008 | Shen | G05B 19/41875 |
| | | | 706/12 |
| 2011/0190919 A1* | 8/2011 | Kiermasz | G05B 15/02 |
| | | | 700/110 |
| 2011/0218794 A1* | 9/2011 | Chockler | G06F 9/44 |
| | | | 703/20 |
| 2011/0246141 A1* | 10/2011 | Li | G01B 21/24 |
| | | | 703/2 |
| 2012/0323356 A1* | 12/2012 | Dziura | G01N 21/47 |
| | | | 700/121 |
| 2013/0073070 A1* | 3/2013 | Tsai | G01N 21/47 |
| | | | 700/103 |
| 2013/0144560 A1* | 6/2013 | Pisarenco | G01N 21/47 |
| | | | 702/189 |
| 2013/0151440 A1* | 6/2013 | Li | G01N 21/9501 |
| | | | 706/12 |
| 2014/0111791 A1 | 4/2014 | Manassen et al. | |
| 2014/0172394 A1 | 6/2014 | Kuznetsov et al. | |
| 2014/0222380 A1 | 8/2014 | Kuznetsov et al. | |
| 2014/0297223 A1* | 10/2014 | Hibbs | G01B 11/24 |
| | | | 702/167 |
| 2014/0367267 A1* | 12/2014 | Egan | G01B 7/105 |
| | | | 205/84 |
| 2015/0006097 A1* | 1/2015 | Gao | H01L 22/12 |
| | | | 702/81 |
| 2015/0046118 A1* | 2/2015 | Pandev | H01L 22/12 |
| | | | 702/155 |
| 2015/0204664 A1 | 7/2015 | Bringoltz et al. | |
| 2016/0216197 A1 | 7/2016 | Bringoltz et al. | |
| 2017/0017738 A1* | 1/2017 | Dirks | G06F 17/5009 |

* cited by examiner

ADAPTIVE NUMERICAL APERTURE CONTROL METHOD AND SYSTEM

CROSS-REFERENCE TO RELATED APPLICATIONS

The present application claims the benefit under 35 U.S.C. § 119(e) of U.S. Provisional Application Ser. No. 62/203,298, filed Aug. 10, 2015. Said U.S. Provisional Application Ser. No. 62/203,298 is hereby incorporated by reference in its entirety.

TECHNICAL FIELD

The disclosure generally relates to the field of semiconductor metrology, and particularly to measurement systems that utilize semiconductor metrology.

BACKGROUND

Thin polished plates such as silicon wafers and the like are a very important part of modern technology. A wafer, for instance, may refer to a thin slice of semiconductor material used in the fabrication of integrated circuits and other devices.

Wafers are subject to inspections, and semiconductor metrology tools can be used to measure certain structural and material characteristics of the wafers at various stages during the fabrication process. These measurements may be used to facilitate process/quality controls and to improve the efficiencies of the fabrication process. It is noted, however, that some of the existing methods for measuring structural and material characteristics of the wafers are inefficient.

SUMMARY

The present disclosure is directed to a system. The system may include a metrology tool configured to obtain metrology data of a wafer and a processor in communication with the metrology tool. The processor may be configured to perform a first electromagnetic simulation to model the metrology data at a first wavelength using a first numerical aperture model. The processor may also be configured to perform a second electromagnetic simulation to model the metrology data at a second wavelength using a second numerical aperture model, wherein the second numerical aperture model is different from the first numerical aperture model. The processor may be further configured to measure at least one characteristic of the wafer to facilitate wafer process control at least partially based on the first and second electromagnetic simulations.

A further embodiment of the present disclosure is directed to a system. The system may include a metrology tool configured to obtain metrology data of a wafer and a processor in communication with the metrology tool. The processor may be configured to perform an electromagnetic simulation to model the metrology data at a particular wavelength. The electromagnetic simulation may include multiple iterations, wherein at least one initial iteration of the electromagnetic simulation is performed using an initial numerical aperture model and at least one subsequent iteration of the electromagnetic simulation is performed using a subsequent numerical aperture model, wherein the initial numerical aperture model defines a reduced number of rays compared to the subsequent numerical aperture model. The process may also be configured to measure at least one characteristic of the wafer to facilitate wafer process control at least partially based on the electromagnetic simulation.

An additional embodiment of the present disclosure is directed to a method. The method may include obtaining metrology data of a wafer; performing a first electromagnetic simulation to model the metrology data at a first wavelength using a first numerical aperture model; performing a second electromagnetic simulation to model the metrology data at a second wavelength using a second numerical aperture model, the second numerical aperture model being different from the first numerical aperture model; and measuring at least one characteristic of the wafer to facilitate wafer process control at least partially based on the first and second electromagnetic simulations.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Embodiments in accordance with the present disclosure are directed to systems and methods for providing efficient modeling and measurement of critical dimensions and/or overlay registrations of wafers. Efficiency is improved in both spectral dimension and temporal dimension. In the spectral dimension, for example, efficiency can be improved by allowing different numerical aperture (NA) models to be used for different wavelengths in electromagnetic calculations. In this manner, not all wavelengths are required to use the same NA model with the same number of rays, effectively providing a balance between computation speed and accuracy. In the temporal dimension, on the other hand, since iterations at the early stages of an electromagnetic calculation are not as crucial as iterations at the final stages of the electromagnetic calculation, different NA models may be used at different stages in the process, effectively improving the computation speed without sacrificing the quality of the final result.

Figure 1:
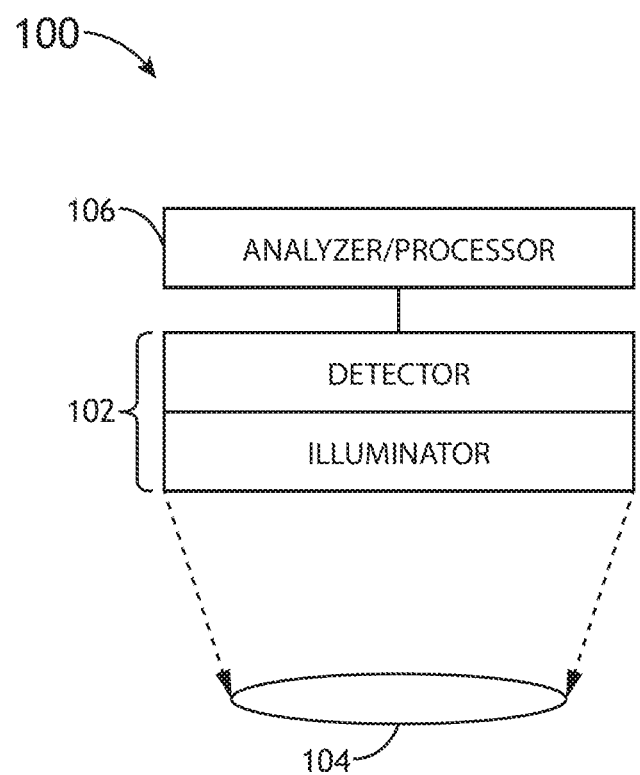
FIG. 1 is a block diagram depicting a metrology system configured in accordance with an embodiment of the present disclosure.

Referring now to FIG. 1, a block diagram depicting an exemplary system 100 configured in accordance with embodiments of the present disclosure is shown. The system 100 may include a metrology tool 102 configured to obtain metrology data of a wafer 104. The metrology tool 102 may include an illuminator configured to illuminate a target (e.g., a region of the wafer 104) and a detector configured to capture relevant information provided by the illuminator's interaction (or lack thereof) with the target.

The system 100 may also include an analyzer/processor 106 in communication with the metrology tool 102. The analyzer 106 may be implemented as dedicated processing units, application-specific integrated circuits (ASICs), field-programmable gate arrays (FPGAs) or various other types of processors or processing units. In some embodiments, the analyzer 106 may be implemented as a stand-alone component. Alternatively, the analyzer 106 may be implemented as an embedded computing component of the metrology tool 102. The analyzer 106 may be configured to analyze the metrology data obtained by the metrology tool 102 in order to measure the structural and material characteristics of the wafer 104. The measurements obtained may then be reported, displayed, or utilized to facilitate process controls and/or to improve efficiencies of the manufacturing process.

In some embodiments, the metrology tool 102 may include one or more hardware configurations configured to help obtain the metrology data. Examples of such hardware configurations include, but are not limited to, spectroscopic ellipsometers (SE), SEs with multiple angles of illumination, SEs capable of measuring Mueller matrix elements (e.g. using rotating compensator(s)), single-wavelength ellipsometers, beam profile ellipsometers (e.g., angle-resolved ellipsometers), beam profile reflectometers (e.g., angle-resolved reflectometers), broadband reflective spectrometers (e.g., spectroscopic reflectometers), single-wavelength reflectometers, angle-resolved reflectometers, imaging systems, scatterometers (e.g., speckle analyzers) and the like.

It is contemplated that the hardware configurations can be separated into discrete operational systems. Alternatively, one or more hardware configurations can be combined into a single metrology tool. One example of such a metrology tool 102 is disclosed in U.S. Pat. No. 7,933,026, entitled "High resolution monitoring of CD variations", the disclosure of which is incorporated herein by reference in its entirety. Other examples of the metrology tool 102 may include that disclosed in U.S. Pat. No. 7,478,019, entitle "Multiple tool and structure analysis", the disclosure of which is incorporated herein by reference in its entirety.

It is noted that while specific implementations of the metrology tool 102 may vary, the purpose of the metrology tool 102 is to obtain metrology data of one or more regions of the wafer 104. The metrology data obtained may then be provided to the analyzer 106, which may carry out a method that is designed to analyze the metrology data and measure the characteristics of the wafer 104. In some embodiments, the characteristics may include the critical dimension and/or the overlay registration of the wafer 104.

Figure 2:
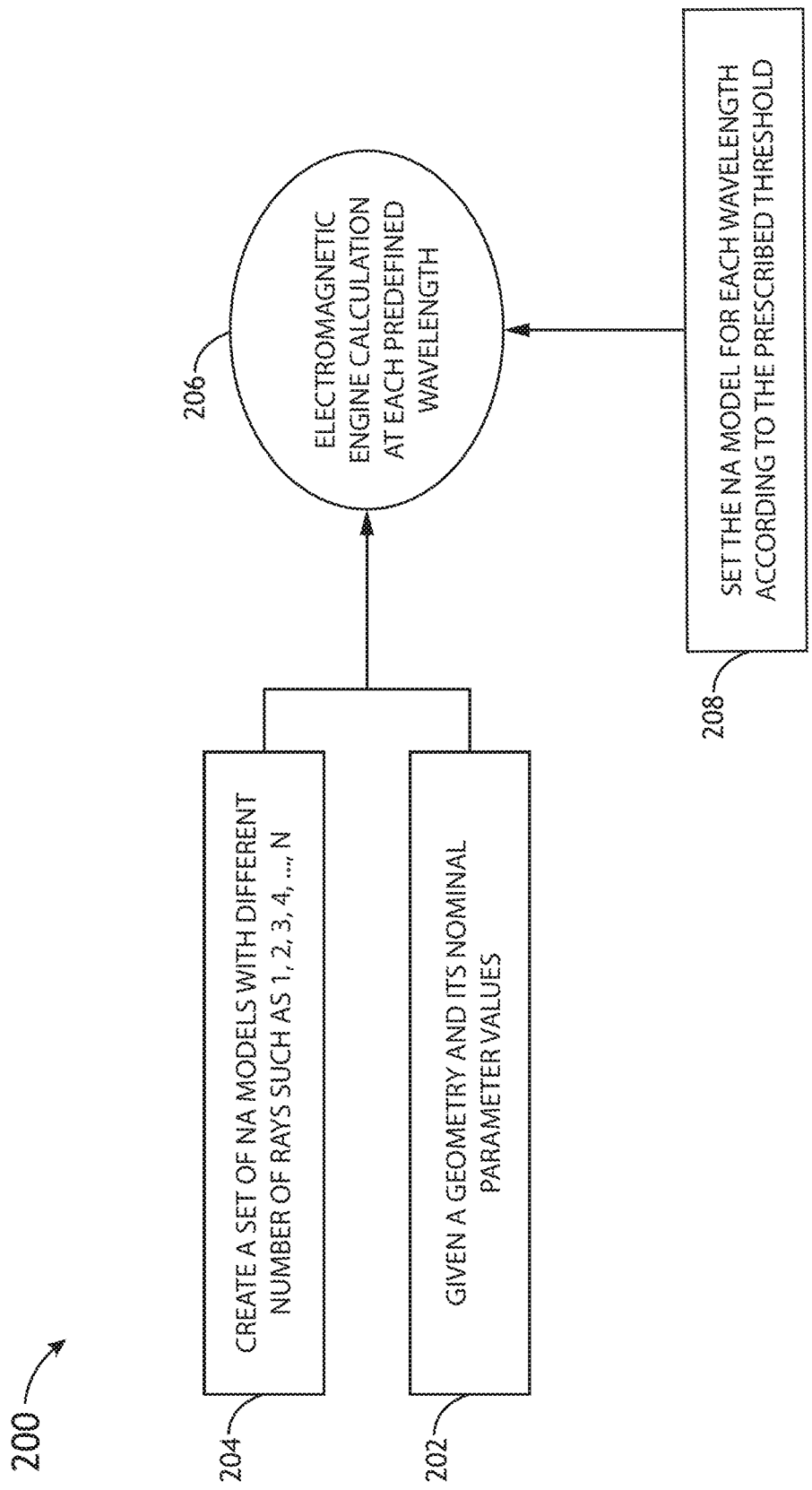
FIG. 2 is a flow diagram depicting an exemplary method for modeling and measurement of one or more characteristics of the wafer.

FIG. 2 is a flow diagram depicting an exemplary method 200 that may be carried out by the analyzer 106 to model/measure the critical dimension and/or the overlay registration of the wafer 104. As shown in FIG. 2, the measured metrology data of the wafer 104 (e.g., wafer geometry and nominal parameter values) may be obtained in a step 202 and a set of numerical aperture (NA) models may be created/defined in a step 204. The NA models may differ from each other in terms of the number of rays and/or the location of the rays. The number of rays, for example, may range from single rays (e.g., 1-ray NA models) to N number of rays (e.g., NA models with i×j number of rays, or N number of rays located in different places without a regular grid). The location of the rays may also differ even if two NA models have the same number of rays.

The NA models defined in this manner may be provided to a modeling step 206 along with the measured metrology data. The modeling step 206 may generate modeled data and try to fit the modeled data on to the measured metrology data as a way to measure the critical dimension and/or the overlay registration of the wafer 104. The modeled data may be generated using electromagnetic simulations performed at different wavelengths, and in accordance with embodiments of the present disclosure, different NA models may be used to perform electromagnetic simulations at different wavelengths. In some embodiments, for example, each wavelength used to perform the electromagnetic simulation can be studied to help select an NA model best suited for that wavelength. For instance, suppose it is determined that electromagnetic simulation at a particular wavelength $\lambda_x$ is best performed (e.g., fast convergence with acceptable accuracy compared against a threshold) using an NA model with a particular number of rays, the NA model with that particular number of rays may be selected in a step 208 for that particular wavelength $\lambda_x$.

Alternatively, the selection step 208 may be carried out at least partially based on a priori knowledge. For instance, suppose a priori knowledge indicates that performing electromagnetic simulations at longer wavelengths may require NA models with lesser number of rays, NA models with lesser number of rays may be selected for longer wavelengths in the step 208. Similarly, suppose a priori knowledge indicates that performing electromagnetic simulations at shorter wavelengths may require NA models with greater number of rays, NA models with greater number of rays may be selected for shorter wavelengths in the step 208.

It is to be understood that the selection step 208 may be carried out in various other manners not specifically described above. It is contemplated that regardless of whether the selection step 208 selects the NA models based on a priori knowledge and/or based on test results, the objective of the selection step 208 is to provide flexibility to the modeling step 206 so that only a subset of wavelengths may need to use NA models with greater number of rays for electromagnetic simulation, effectively providing a balance between computational speed and accuracy in the spectral dimension.

Figure 3:
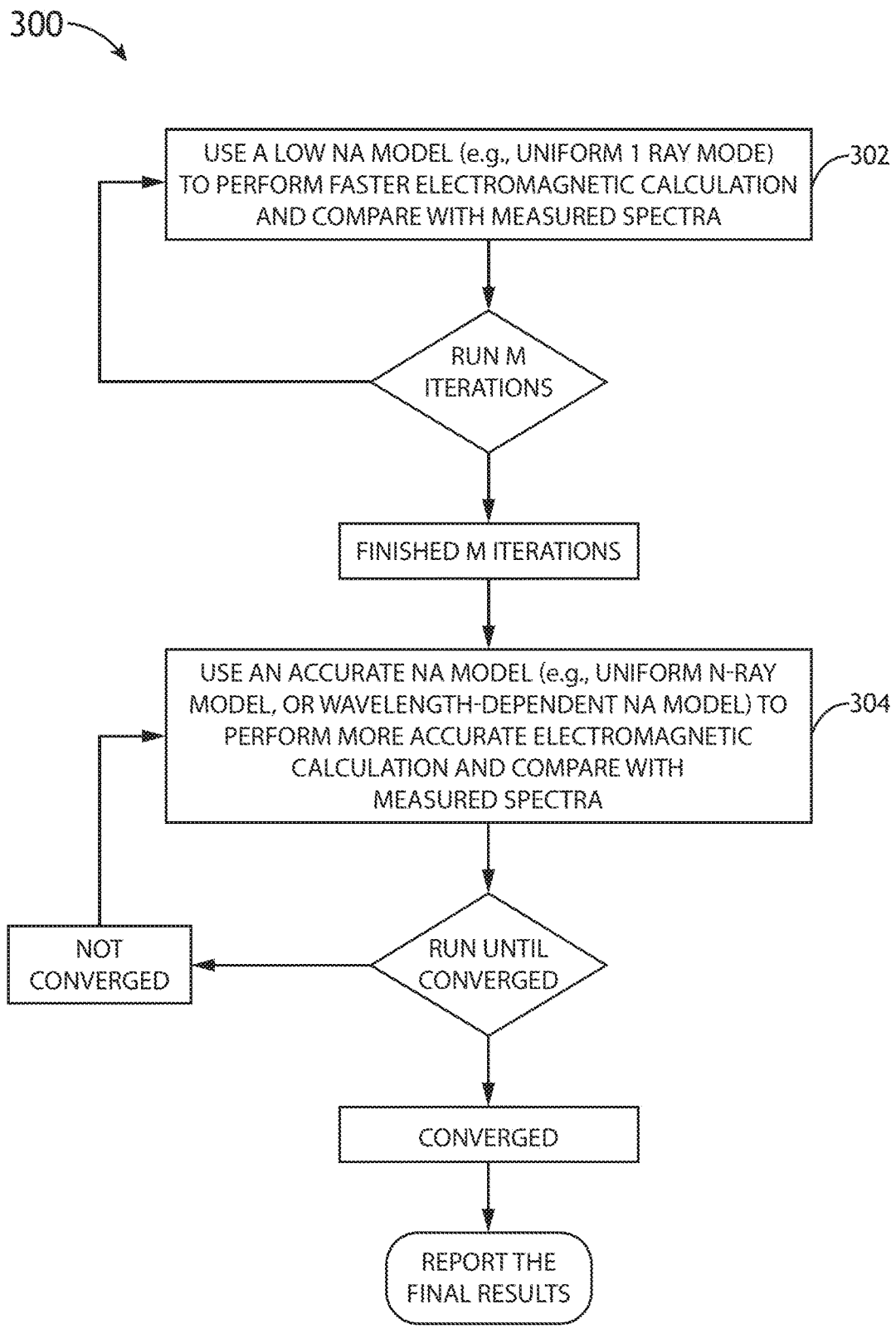
FIG. 3 is a flow diagram depicting an exemplary method for adjusting numerical aperture models used in during a simulation process.

Additionally, it is noted that the flexibility of using different NA models is not only applicable in the spectral dimension, but also applicable in the temporal dimension. FIG. 3 is a flow diagram depicting an exemplary method 300 that may be carried out by the analyzer 106 to adjust NA models used in the temporal dimension. More specifically, it is noted that not all iterations of an electromagnetic simulation process (which is typically performed iteratively) need to use the same NA model. It is therefore contemplated that it may be beneficial to configure the simulation process so that an NA model with a first (reduced) number of rays (e.g., 1-ray NA models) can be used in the first M iterations 302 of the iterative process and an NA model with a second (greater) number of rays (e.g., selected based on the wavelength) can be used in iterations 304 after that.

It is noted that the number of iterations, M, may be determined based on a priori knowledge. Alternatively, M may be determined adaptively based on the performance of the iterative process. For example, if it is determined that the rate of convergence is below a certain threshold after using a particular NA model for several iterations, that particular NA model may be replaced by an NA model with a greater number of rays for subsequent iterations.

As will be appreciated from the above, systems and methods configured in accordance with the present disclosure can provide flexibility to electromagnetic simulations by allowing different NA models to be selected based on particular wavelengths and/or particular iterations. In other words, systems and methods configured in accordance with the present disclosure can be wavelength-dependent and/or iteration-adaptive to provide users with refined control over NA modeling in both spectral dimension and temporal dimension.

In the spectral dimension, the NA models can be controlled so that only a subset of wavelengths may need to use NA models with greater number of rays, effectively providing a balance between computational speed and accuracy. In the temporal dimension, the NA models can be controlled to allow NA models with reduced number of rays to be used in the first few iterations. Since the first few iterations typically have much less influence compared to the last few iterations, providing the NA model control in this manner can save computation efforts without sacrificing the quality of the final result. It is noted that allowing different NA models to be selected based on particular wavelengths and/or particular iterations can improve the efficiency of the modeling/measurement process compared to using a fixed NA model throughout the entire process, which either sacrifices computation speed over accuracy, or sacrifice accuracy over computation speed.

It is to be understood that while the examples above referred to a wafer as the subject of measurement, systems and methods configured in accordance with the present disclosure are not limited to measuring wafers. The systems and methods configured in accordance with the present disclosure are applicable to other types of subjects as well without departing from the spirit and scope of the present disclosure. The term wafer used in the present disclosure may include a thin slice of semiconductor material used in the fabrication of integrated circuits and other devices, as well as other thin polished plates such as magnetic disc substrates, gauge blocks and the like.

It is believed that the system and the apparatus of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A system, comprising:
a metrology tool configured to obtain metrology data of a wafer; and
a processor in communication with the metrology tool, the processor configured to:
generate a plurality of numerical aperture models based on acquired metrology data from the metrology tool, wherein a first numerical aperture model is defined by a first number of rays and a second numerical aperture model is defined by a second number of rays different from the first number;
perform a plurality of electromagnetic simulations at a plurality of predefined wavelengths using at least some of the generated numerical aperture models, wherein a first electromagnetic simulation is performed at a first wavelength and a second electromagnetic simulation is performed at a second wavelength;
analyze a first rate of convergence of the electromagnetic simulations for the first numerical aperture model and compare the electromagnetic simulations to a predefined threshold to identify whether the first rate of convergence is below the predefined threshold during a first set of iterations;
upon determining the first rate of convergence for the first numerical aperture model is below the predefined threshold for the first set of iterations, analyze a second rate of convergence of the electromagnetic simulations for the second numerical aperture model and compare the electromagnetic simulations to the predefined threshold to identify whether the second rate of convergence is below the predefined threshold for the second numerical aperture model during a second set of iterations;
upon determining the second rate of convergence is above the predefined threshold for the second numerical aperture model, apply the second numerical aperture model for each predefined wavelength to the acquired metrology data from the metrology tool to determine at least one characteristic of the wafer; and
provide correction to one or more process tools of a wafer fabrication facility based on the at least one characteristic of the wafer.

2. The system of claim 1, wherein the at least one characteristic of the wafer includes at least one of a critical dimension of one or more targets of the wafer, an overlay of registration from one or more overlay targets of the wafer, or a thickness of a film of the wafer.

3. The system of claim 1, wherein rays defined in the first numerical aperture model are located differently compared to rays defined in the second numerical aperture model.

4. The system of claim 1, wherein the first electromagnetic simulation is iteratively performed, wherein at least one initial iteration of the first electromagnetic simulation is performed using a reduced numerical aperture model and at least one subsequent iteration of the first electromagnetic simulation is performed using the first numerical aperture model, wherein the reduced numerical aperture model defines a reduced number of rays compared to the first numerical aperture model.

5. The system of claim 4, wherein the at least one initial iteration includes a predetermined number of initial iterations.

6. The system of claim 4, wherein the second electromagnetic simulation is iteratively performed, wherein at least one initial iteration of the second electromagnetic simulation is performed using the reduced numerical aperture model and at least one subsequent iteration of the second electromagnetic simulation is performed using the second numerical aperture model.

7. A system, comprising:
a metrology tool configured to obtain metrology data of a wafer; and
a processor in communication with the metrology tool, the processor configured to:
perform an electromagnetic simulation to model the metrology data, wherein the electromagnetic simulation comprises a first portion and a second portion, wherein the first portion of the electromagnetic simulation comprises a plurality of iterations, wherein each iteration is performed using a single-ray numerical aperture model across a set of predefined wavelengths, wherein the second portion of the electromagnetic simulation comprises a multiple-ray numerical aperture model,
analyze a first rate of convergence of the second portion of the electromagnetic simulation for a first numerical aperture model and compare the electromagnetic simulations to a predefined threshold to identify whether the first rate of convergence is below the predefined threshold during a first set of iterations;

upon determining the first rate of convergence for the first numerical aperture model is below the predefined threshold for the first set of iterations, analyze a second rate of convergence of the electromagnetic simulations for a second numerical aperture model and compare the electromagnetic simulations to the predefined threshold to identify whether the second rate of convergence is below the predefined threshold for the second numerical aperture model during a second set of iterations;

upon determining the second rate of convergence is above the predefined threshold for the second numerical aperture model, apply the second numerical aperture model for each predefined wavelength to the acquired metrology data from the metrology tool to determine at least one characteristic of the wafer; and provide correction to one or more process tools of a wafer fabrication facility based on the at least one characteristic of the wafer.

8. The system of claim 7, wherein the at least one characteristic of the wafer includes at least one of a critical dimension of one or more targets of the wafer, an overlay of registration from one or more overlay targets of the wafer, or a thickness of a film of the wafer.

9. The system of claim 7, wherein the first portion of the electromagnetic simulation includes a predetermined number of initial iterations.

10. A method, comprising:
obtaining metrology data of a wafer;
generating a plurality of numerical aperture models based on the metrology data from the wafer, wherein a first numerical aperture model is defined by a first number of rays and a second numerical aperture model is defined by a second number of rays different from the first number;
performing a plurality of electromagnetic simulations at a plurality of predefined wavelengths using at least some of the generated numerical aperture models, wherein a first electromagnetic simulation is performed at a first wavelength and a second electromagnetic simulation is performed at a second wavelength;
analyzing a first rate of convergence of the electromagnetic simulations for the first numerical aperture model and compare the electromagnetic simulations to a predefined threshold to identify [[a ]]whether the first rate of convergence is below the predefined threshold during a first set of iterations;
upon determining the first rate of convergence for the first numerical aperture model is below the predefined threshold for the first set of iterations, analyzing a second rate of convergence of the electromagnetic simulations for the second numerical aperture model and compare the electromagnetic simulations to the predefined threshold to identify whether the second rate of convergence is below the predefined threshold for the second numerical aperture model during a second set of iterations;
upon determining the second rate of convergence is above the predefined threshold for the second numerical aperture model, applying the second numerical aperture model for each predefined wavelength to the acquired metrology data from the metrology tool to determine at least one characteristic of the wafer; and providing correction to one or more process tools of a wafer fabrication facility based on the at least one characteristic of the wafer.

11. The method of claim 10, wherein the at least one characteristic of the wafer includes at least one of a critical dimension of one or more targets of the wafer, an overlay of registration from one or more overlay targets of the wafer, or a thickness of a film of the wafer.

12. The method of claim 10, wherein rays defined in the first numerical aperture model are located differently compared to rays defined in the second numerical aperture model.

13. The method of claim 10, wherein the first electromagnetic simulation is iteratively performed, wherein at least one initial iteration of the first electromagnetic simulation is performed using a reduced numerical aperture model and at least one subsequent iteration of the first electromagnetic simulation is performed using the first numerical aperture model, wherein the reduced numerical aperture model defines a reduced number of rays compared to the first numerical aperture model.

14. The method of claim 13, wherein the at least one initial iteration includes a predetermined number of initial iterations.

15. The method of claim 10, wherein the second electromagnetic simulation is iteratively performed, wherein at least one initial iteration of the second electromagnetic simulation is performed using the reduced numerical aperture model and at least one subsequent iteration of the second electromagnetic simulation is performed using the second numerical aperture model.

16. A method, comprising:
obtaining metrology data of a wafer;
performing an electromagnetic simulation to model the metrology data from the wafer, wherein the electromagnetic simulation comprises a first portion and a second portion, wherein the first portion of the electromagnetic simulation comprises a plurality of iterations, wherein each iteration is performed using a single-ray numerical aperture model across a set of predefined wavelengths, wherein the second portion of the electromagnetic simulation comprises a multiple-ray model, wherein a preferred numerical aperture model is identified for each predefined wavelength of the set of predefined wavelengths to improve the efficiency of a numerical aperture modeling process;
analyzing a first rate of convergence of the second portion of the electromagnetic simulation for a first numerical aperture model and compare the electromagnetic simulations to a predefined threshold to identify whether the first rate of convergence is below the predefined threshold during a first set of iterations;
upon determining the first rate of convergence for the first numerical aperture model is below the predefined threshold for the first set of iterations, analyzing a second rate of convergence of the electromagnetic simulations for a second numerical aperture model and compare the electromagnetic simulations to the predefined threshold to identify whether the second rate of convergence is below the predefined threshold for the second numerical aperture model during a second set of iterations;
upon determining the second rate of convergence is above the predefined threshold for the second numerical aperture model, applying the second numerical aperture model for each predefined wavelength to the acquired metrology data from the metrology tool to determine at least one characteristic of the wafer; and providing correction to one or more process tools of a wafer fabrication facility based on the at least one characteristic of the wafer.

17. The method of claim 16, wherein the at least one characteristic of the wafer includes at least one of a critical dimension of one or more targets of the wafer, an overlay of registration from one or more overlay targets of the wafer, or a thickness of a film of the wafer.

18. The system of claim 16, wherein the first portion of the electromagnetic simulation includes a predetermined number of initial iterations.

* * * * *